(12) United States Patent
Miller

(10) Patent No.: US 7,552,037 B2
(45) Date of Patent: Jun. 23, 2009

(54) SIMULATING A SENSING SYSTEM

(75) Inventor: Shawn W. Miller, Denver, CO (US)

(73) Assignee: Raytheon Company, Waltham, MA (US)

( * ) Notice: Subject to any disclaimer, the term of this patent is extended or adjusted under 35 U.S.C. 154(b) by 734 days.

(21) Appl. No.: 11/175,066

(22) Filed: Jul. 5, 2005

(65) Prior Publication Data

US 2006/0005077 A1     Jan. 5, 2006

Related U.S. Application Data

(60) Provisional application No. 60/585,404, filed on Jul. 2, 2004.

(51) Int. Cl.
*G06F 17/50* (2006.01)
*G06K 9/00* (2006.01)

(52) U.S. Cl. .............................. 703/2; 703/18; 382/173; 382/276

(58) Field of Classification Search .................... 703/6, 703/2, 10, 18; 382/173, 276
See application file for complete search history.

(56) References Cited

U.S. PATENT DOCUMENTS 5,652,717 A * 7/1997 Miller et al. .................... 703/6
7,242,803 B2 * 7/2007 Miller ......................... 382/173

2006/0293872 A1 * 12/2006 Zamora et al. ................ 703/10

OTHER PUBLICATIONS

King, Michael D., et al., "*Airborne Scanning Spectrometer for Remote Sensing of Cloud, Aerosol, Water Vapor, and Surface Properties*", Journal of Atmospheric and Oceanic Technology, vol. 13, No. 4, pp. 777-794, Aug. 1996.

Barnes, William L., et al., "*Prelaunch Characteristics of the Moderate Resolution Imaging Spectroradiometer (MODIS) on EOS-AM1*", IEEE Transactions On Geoscience And Remote Sensing, vol. 36, No. 4, pp. 1088-1100, Jul. 1998.

National Oceanic and Atmospheric Administration (NOAA), NOAA KLM User's Guide, Introduction Page and Sections 1.0, 1.1, and 1.2, http://www2.ncdc.noaa.gov/docs/klm./, 9 total pages, Sep. 2000.

Börner, Anko, "*The Optimization Of The Stereo Angle Of CCD-Line-Scanners*", XP-002390542, International Archives of Photogrammetry and Remote Sensing, vol. 31, No. B//1, pp. 26-30, 1996.

Gregg, Watson W., "*Development of a Simulated Data Set for the SeaWiFS Mission*", IEEE Transactions on Geoscience and Remote Sensing, vol. 35, No. 2, pp. 421-435, Mar. 1997.

Börner, Anko, et al., "*SENSOR: a tool for the simulation of hyperspectral remote sensing systems*", XP-002390353, ISPRS Journal of Photogrammetry & Remote Sensing, pp. 299-312, Jan. 16, 2001.

(Continued)

*Primary Examiner*—Thai Phan
(74) *Attorney, Agent, or Firm*—Baker Botts L.L.P.

(57) ABSTRACT

A simulator for simulating a sensing system includes modules operable to simulate sensors sensing a scene. The modules include: a path modeling module operable to model a path for each sensor; a radiative transfer module operable to model a transfer of radiance from the scene to each sensor; and instrument response modules operable to model the response of the sensors to the transferred radiance. A control module manages the operation of the modules.

23 Claims, 5 Drawing Sheets

OTHER PUBLICATIONS

Verhoef, Wout, et al., "*Remote sensing data assimilation using coupled radiative transfer models*", XP-002390357, Physics and Chemistry of the Earth, vol. 28, pp. 3-13, 2003.

Houzelle, S., et al., "*Hyperspectral Image Simulator to support SPECTRA Mission System Study*", XP-010704596, ISBN: 0-7803-7929-2/03, © 2003 IEEE, pp. 2075-2077, Jul. 21, 2003.

Verhoef, Wout, et al., "*Simulation of hyperspectral and directional radiance images using coupled biophysical and atmospheric radiative transfer models*", XP-002390358, Remote Sensing of Environment 87, Elsevier, pp. 23-41, Sep. 15, 2003.

Miller, Shawn W. et al., "*End-to-end simulation for support of remote sensing systems design*", Proceedings of the SPIE—The International Society for Optical Engineering SPIE-INT., vol. 5548, ISSN: 0277-786X, pp. 380-387, 2004.

PCT Notification of Transmittal of The International Search Report and the Written Opinion of the International Searching Authority, or the Declaration, International Application No. PCT/US2005/023344, dated Aug. 9, 2006, 13 pages.

\* cited by examiner

Channel Editor

CHANNEL SELECTION — 404
S/C [...] ▼  Sensor [...] ▼  Channel [1] ▼

CHANNEL TOGGLES — 408
Channel ⊙ OFF ○ ON

DATA COMPRESSION — 412
Algorithm [JPEG-20...] ▼  Parameter [0.250]

DETECTOR/FPA PARAMETERS — 416
| Parameter | Value |
|---|---|
| Det Size Along Scan (μm) | 26.000 |
| Det Size Cross Scan (μm) | 26.000 |
| IFOV Along Scan (μrad) | 18.665 |
| IFOV Cross Scan (μrad) | 18.665 |
| Nadir GSD (km) | 0.650 |
| ASD (μrad) | 18.164 |
| Columns | 1 |
| Gap (μm) | 1500.000 |
| Settle Time (μs) | 15.000 |
| Reset Time (μs) | 5.000 |
| Frame Time (μs) | 473.042 |
| Integration Time (μs) | 453.042 |
| Integration Drag (μrad) | 17.396 |
| Quantum Efficiency | 0.890 |
| Saturation Margin | 0.100 |

SPECTRAL PARAMETERS — 420
| Parameter | Value |
|---|---|
| Center (μm) | 0.470 |
| Width (μm) | 0.040 |
| Detector Cuton (μm) | 0.430 |
| Detector Cutoff (μm) | 0.510 |
| RSR E Value | 6.000 |
| # Wavelengths | 10 |

MTF PARAMETERS — 424
| Parameter | Value |
|---|---|
| Blur Radius (μm) | 0.000 |
| Manuf Tolerance | 0.896 |

DIGITIZATION PARAMETERS — 428
| Parameter | Value |
|---|---|
| Bits D/L | 12 |
| Bits ADC | 14 |
| ADC Equivalent | 11.500 |
| Space View Offset | 400 |

RADIOMETRY PARAMETERS — 432
| Parameter | Value |
|---|---|
| Lsun (Wm−2sr−1μm−1) | 651.900 |
| Lmax (Wm−2sr−1μm−1) | 651.900 |
| Qmax (pcm−2s−1) | 6.813E13 |
| Calibration Error | 0.000 |
| NEC Leakage (e−) | 4.420 |
| NEC Readout (e−) | 45.100 |
| NEC System (e−) | 3.670 |
| NEC Digit (e−) | 24.293 |
| DC Restore Samples | 100 |
| Drift Time (s) | 9.000 |
| 1/f Current (AHz−1/2) | 0.000 |
| 1/f Knee (Hz) | 0.000 |
| Warm Transmittance | 0.473 |
| Cold Transmittance | 0.816 |
| Total Transmittance | 0.386 |

SIMULATING A SENSING SYSTEM

RELATED APPLICATION

This application claims benefit under 35 U.S.C. § 119(e) of U.S. Provisional Application Ser. No. 60/585,404, entitled "SIMULATING A SENSING SYSTEM," filed Jul. 2, 2004, by Shawn W. Miller.

TECHNICAL FIELD

This invention relates generally to the field of sensors and more specifically to simulating a sensing system.

BACKGROUND

A sensing system senses a scene and generates data describing the scene. A sensing system may be simulated in order to design and develop the sensing system. Known techniques for simulating sensing systems include running various computer programs that perform different parts of the simulation.

SUMMARY OF THE DISCLOSURE

In accordance with the present invention, disadvantages and problems associated with previous techniques for simulating a sensing system may be reduced or eliminated.

According to one embodiment of the present invention, a simulator for simulating a sensing system includes modules operable to simulate sensors sensing a scene. The modules include: a path modeling module operable to model a path for each sensor; a radiative transfer module operable to model a transfer of radiance from the scene to each sensor; and instrument response modules operable to model the response of the sensors to the transferred radiance. A control module manages the operation of the modules.

Certain embodiments of the invention may provide one or more technical advantages. A technical advantage of one embodiment may be that the simulator may integrate various modules such that output from one module may be automatically input into the next module. Integrating the modules may provide for more efficient simulation, since user intervention may be reduced.

Another technical advantage of one embodiment may be that the simulator may receive any of a variety of types of data, and may select instrument response appropriate for the type of data. This may allow for more efficient processing of different types of data. Another technical advantage of one embodiment may be that the simulator may provide for comprehensive sensing system simulation. The simulator may provide information on how to optimize the aperture and detectors of the sensing system and the spectral channels. The simulator may also provide information on how to lay out the spacecraft and to time the ground system processing.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1 through 4 of the drawings, like numerals being used for like and corresponding parts of the various drawings.

Figure 1:
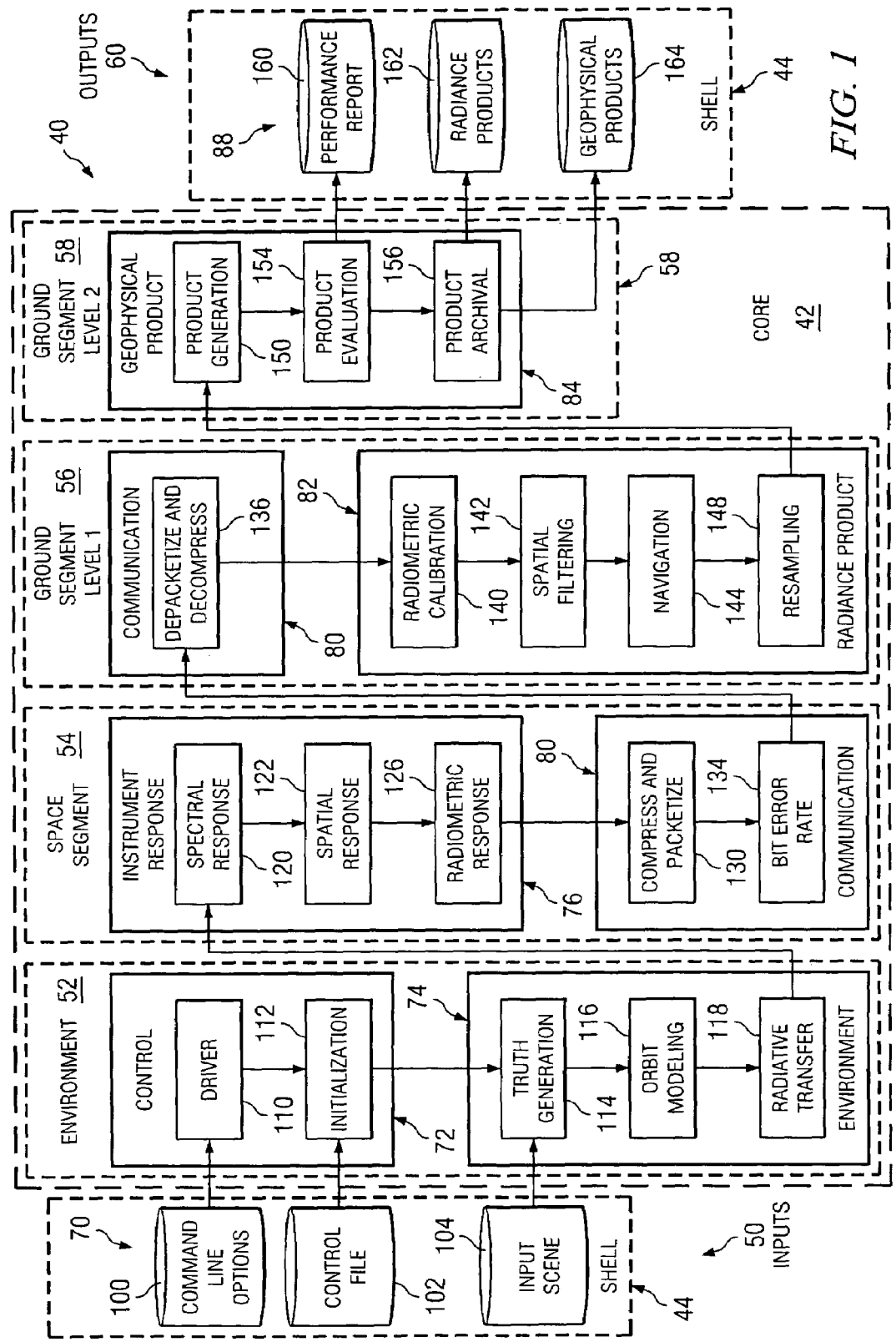
FIG. 1 is a block diagram of one embodiment of a simulator operable to simulate a sensing system.

FIG. 1 is a block diagram of one embodiment of a simulator 40 for simulating a sensing system. In general, simulator 40 models the path of a sensor operable to sense an input scene. The transfer of radiance from the scene to the sensor and the response of the sensor to the radiation are also modeled. Geophysical products determined from the response of the sensor may be compared with the input scene, and the sensor may be evaluated in accordance with the comparison.

According to the illustrated embodiment, simulator 40 simulates a sensing system. A sensing system may include one or more sensors and one or more processing modules. A sensor may refer to any suitable electro-optical sensor, such as a scanning visible/infrared imager or radiometer. Sensors receive radiation reflected from a scene that includes information about the scene. Processing modules process the information to determine product data describing the scene.

Simulator 40 may model one or more features of the environment, received radiation, instrument response, data communication, radiance product generation, geophysical product generation, other aspect, or any combination of the preceding. Simulator 40 may integrate segments, such as space, command and control, data processing, and archive segments. Simulator 40 may be used to determine, for example, the optimal allocation of performance requirements to the segments that may be driven by technical, physical, and programmatic constraints.

According to one embodiment, a sensor may be located at a platform of the sensing system. The platform may be located on, for example, a parent vehicle such as an aircraft or a spacecraft, and the processing modules may be located on the ground. The sensors and processing modules, however, may be located in any combination at one or more locations.

According to the illustrated embodiment, simulator 40 includes a core 42 and a shell 44. Core 42 performs the simulation, and may have the capability to run from command lines. Core 42 may be coded in any suitable programming language, for example, the C programming language. Shell 44 manages input into core 42 and output from core 42. Shell 44 may be coded in any suitable language, for example, the Java programming language. Shell 44 may be associated with graphical user interfaces. Example interfaces are described with reference to FIGS. 4 and 5.

A sensing system situation may be represented by inputs 50, an environment 52, a space segment 54, a level 1 ground segment 56, a level 2 ground segment 58, and outputs 60. The situation however, may be organized in any suitable manner. According to the illustrated embodiment, the components of simulator 40 are organized as input databases 70, control modules 72, environment modules 74, instrument response modules 76, communication modules 80, radiance product modules 82, geophysical product modules 84, and output databases 88 coupled as shown. Simulator 40 may, however, include more, fewer, or other components organized in any suitable manner.

Inputs 50 refer to information that is supplied to system 10. The information may be stored at one or more databases 24. According to the illustrated embodiment, inputs 50 are represented by command line options 100, a control file 102, and an input scene 104. Command line options 100 may include commands supplied to system 10 by a user.

Control file 102 describes the environment and the sensing system, and may include any information suitable for describing the environment and the sensing system. Control file 102 includes parameters that may be used to model the sensor platforms, each with one or more sensors and one or more spectral channels, and level one and level two processes. Control file 102 may also include parameters related to scene selection, orbit modeling, radiative transfer modeling, and communications bit error rate between the sensor platform and the processing modules.

Input scene 104 describes a scene that sensing system may sense during simulation. For example, input scene 104 may include data that describes the geographical features of an area. Input scene 104 may refer to any suitable scene to be sensed by a sensing system, and may be a real or simulated scene. Input scene 104 may also form the radiometric input to each sensor through the generation of top-of-atmosphere (TOA) radiances, the nature of which are guided by orbit modeling module 116 and radiative transfer model 118. Shell 44 may be used to adjust command line options 100 and control file 102 in order to select an input scene.

Environment 52 refers to a simulated environment that a sensing system may sense by generating sensory data in response to the environment. Environment 52 is represented by control modules 72 and environment modules 74. Control modules 72 receive instructions from input databases 70 and direct the operation of simulator 40 in accordance with the instructions. Control modules 72 include a driver module 110, an initialization module 112, other suitable module, or any combination of the preceding. Driver module 110 directs the operation of simulator 40, and initializes the model using command line options 100 and parameters from control file 102.

Initialization module 112 controls the parameters of simulator 40. Initialization module 112 also determines the size of arrays used to store system parameters and the memory allocation for performing the operations. Initialization module 112 may also activate or deactivate instrument response modules 76 in response to receiving particular type of data. A type of data may refer to whether data is real, simulated, or a combination of both real and simulated data. As an example, initialization module 112 may determine that data is high spatial response data, and activate spatial response module 122 in response to the determination.

Environment modules 74 generate the simulated environment. Environment modules 74 include a truth generation module 114, an orbit modeling module 116, a radiative transfer module 118, other suitable module, or any combination of the preceding. Truth generation module 114 receives input scene 104 and generates a true scene describing input scene 104. The true scene may be later compared with product data generated by the sensing system to evaluate how well the sensing system sensed the scene. The true scene need not be a real scene and may be a simulated scene.

Orbit modeling module 116 models the orbits of the sensors. Orbit modeling module 116 may describe, for example, the altitude of a spacecraft carrying a sensor and where in the orbit the spacecraft is located. Orbit modeling module 116 is an example of a path modeling module. A path modeling module describes the location of the sensor, typically with respect to time. A path modeling module may be used to determine the location of the scene with respect to the sensors and the geometry for the radiative transfer.

The path of the sensor may be modeled by one or more of the orbit, altitude, speed, or other orbital element; roll, pitch, or yaw elements; roll, pitch, or yaw rates; other parameter; or any combination of the preceding. Orbital elements, altitude, and altitude rates may be used to determine other factors. As an example, spacecraft disturbances may be determined and propagated into the line of sight for the sensors. As another example, viewing geometry for the radiative transfer modeling of the atmosphere and surface reflectance characterization may be determined. As another example, solar geometry for radiative transfer and thermal distortion of each sensor may be determined. As yet another example, orbit-related errors in the line-of-sight knowledge may be determined.

Radiative transfer module 118 simulates how the earth's atmosphere affects radiation traveling from the scene to the sensing system. For example, the earth's atmosphere may filter certain signals. Radiative transfer module 118 is an example of a signal modifier module. A signal modifier module describes how signals may be modified when traveling from the scene to the sensing system. Modification refers to changes in signal features such as phase, amplitude, frequency, other suitable feature, or any combination of the preceding. A modification may refer to an increase, a decrease, or an elimination. Radiative transfer module 118 may be switched into an active or an inactive mode by initialization module 112.

Space segment 54 refers to the sensor and the sensor platform. Space segment 54 may be represented by instrument response modules 76 and communication modules 80. Instrument response modules 76 describe the response of the sensors to radiation received from the scene. Instrument response modules 76 include a spectral response module 120, a spatial response module 122, a radiometric response module 126, other suitable module, or any combination of the preceding.

Spectral response module 120 combines hyper-spectral data to yield an integrated measurement. Spectral response module 120 may average hyper-spectral data to yield an integrated radiance. Spatial response module 122 combines data having a spatial resolution greater than that of the sensing system data to yield an integrated measurement. For example, data of approximately fifty meters resolution sensed by an instrument with five hundred meters resolution, may be averaged to yield an integrated measurement. Radiometric response module 126 models the sensing system's sensitivity to radiation. The sensitivity may be modeled by specifying the accuracy, bias, noise, other feature, or any combination of the preceding. Radiometric response module 126 may also convert radiance data into digital data.

One or more instrument response modules 76 may be switched into an active or an inactive mode by initialization module 112. Spectral response module 120 is applied when the input includes hyper-spectral data. Spatial response module 122 is applied when the input includes data having a spatial resolution greater than that of the simulated output of the sensing system. Radiometric response module 126 is applied when the input includes simulated data or real data that includes surface measurements or high-spatial-resolution TOA measurements.

TABLE 1 describes example ways of switching instrument response modules 76.

TABLE 1

| Scene Type | Abbreviation | Example | Toggle | | |
|---|---|---|---|---|---|
| | | | Spectral | Spatial | Radiometric |
| Real scene, high spatial resolution | RHR | MAS, ETM+ | Off | On | On |
| Real scene, low spatial resolution | RLR | MODIS, AVHRR | Off | Off | Off |
| Simulated scene, high spatial resolution | SHR | MODTRAN4 + high resolution surface classification | Off | On | On |
| Simulated scene, low spatial resolution | SLR | MODTRAN4 + low resolution surface classification | Off | Off | On |
| Simulated scene, hyperspectral | SHS | MODTRAN4 + spectral library | On | Off | On |
| Test scene, high spatial resolution | THR | Uniform scene | Off | On | On |
| Test scene, hyperspectral | THS | Out-of-band response scene | On | On | On |

In Table 1, "MAS" represents a MODIS Airborne Simulator, "ETM+" represents the Enhanced Thematic Mapper Plus program, "MODIS" represents a Moderate-resolution Imaging Spectroradiometer, and "AVHRR" represents an Advanced Very High Resolution Radiometer.

Communication modules 80 describe the communication of data from space segment 54 to level 1 ground segment 56. Communication modules 80 may include a compress and packetize module 130, a bit error rate module 134, and a depacketize and decompress module 136. Compress and packetize module 130 compresses and packetizes the data for communication. The data may be sent from space segment 54 to level 1 ground segment 56 using an adjustable bit error rate module 134.

Data may be communicated using any suitable communication network. A communication network may comprise all or a portion of public switched telephone network (PSTN), a public or private data network, a local area network (LAN), a metropolitan area network (MAN), a wide area network (WAN), a global computer network such as the Internet, a wireline or wireless network, a local, regional, or global communication network, an enterprise intranet, other suitable communication link, or any combination of the preceding.

Level 1 ground segment 56 refers to processing modules that perform Level 1 processing of the data received from the sensors. Level 1 processing refers to processing of the data to yield radiance products. A radiance product refers to data that describes the radiance. Level 1 ground segment 56 is represented by depacketize and decompress module 136 and radiance product modules 82. Depacketize and decompress module 136 of level 1 ground segment 56 depacketizes and decompresses the data from space segment 54.

Radiance product modules 82 generate radiance products from the data. Radiance product modules 82 include a radiometric calibration module 140, a spatial filtering module 142, a navigation module 144, a resampling module 148, other suitable module, or any combination of the preceding.

Radiometric calibration module 140 converts the digital data back to radiance data. Spatial filtering module 142 filters the data to, for example, sharpen or blur some or all of the data. Navigation module 144 maps the data to a coordinate system. The coordinate system may refer to, for example, a coordinate system for an instrument. Navigation module 144 may model where a sensor is pointing with respect to the scene, while taking into account line-of-sight errors.

Resampling module 148 translates the data from one coordinate system to another coordinate system. For example, resampling module 148 may translate the data from an instrument coordinate system to an earth-based coordinate system. Resampling module 148 may use the radiance data, the line-of-sight information, and the locations to translate the data.

Level 2 ground segment 58 refers to processing modules that process radiance product data to generate geophysical products. A geophysical product may refer to an geophysical feature of the scene. A geophysical feature may include, for example, the temperature, size, shape, brightness, other suitable feature, or any combination of the preceding, of portions of the scene. Level 2 ground segment 58 is represented by geophysical product modules 84.

Geophysical product modules 84 include a product generation module 150, a product evaluation module 154, and a product archival module 156. Product generation module 150 generates geophysical products from radiance product data. Product generation module 150 may be configured to accept algorithms that may be used to calculate a geophysical product from one or more radiance products.

Product evaluation module 154 evaluates the accuracy of the sensing system. Product evaluation module 154 compares the geophysical product data received from the sensing system with the true scene generated by truth generation module 114 to determine differences between the geophysical products and the true scene. Product evaluation module 154 may evaluate the magnitude of the differences to determine the accuracy. Product archival module 156 archives the radiance and geophysical products. Product archival module 156 may allow user to select the format in which the data is stored.

Outputs 60 refers to the outputs of simulator 40, and are represented by output databases 88. Output databases 88 include a performance report 160, radiance products 162, and geophysical products 164. Performance report 160 records the evaluation performed by product evaluation module 154. Performance report 160 may include analysis files that may be opened and processed by shell 44 to provide the user with a numerical and graphical summary of the performance with respect to radiometric, spatial, navigational, geophysical, other factor, or any combination of the preceding. TABLE 2 illustrates example performance report parameters.

TABLE 2

| Parameter | Description |
|---|---|
| Radiometry | Bias, bias-adjusted (root-mean-square) RMS error, and RMS error vs. truth as a function of signal level for each spectral channel. |
| Image Navigation and Registration (INR) | System level navigation and registration (across image and between channels) uncertainty for each channel or pair of channels. |
| Modulation Transfer Function (MTF) | MTF performance at $1/4$, $1/2$, $3/4$, and 1 times the pixel Nyquist spatial frequency for each spectral channel. |
| Spatial Response Uniformity (SRU) | Normalized radiance difference between any two spectral channels due to spatial response differences for a structured scene. |

TABLE 2-continued

| Parameter | Description |
| --- | --- |
| Edge Response | Overshoot/undershoot performance when scanning across a sharp radiance boundary. |
| Out Of Band (OOB) Response | Effects of large signals in other channels on the current channel. |
| Geophysical Product Accuracy | Bias, bias-adjusted RMS error, and RMS error vs. truth as a function of geophysical product value for each product. |

Radiance products 162 stores the radiance products generated by radiance product modules 82. Geophysical products 164 store the geophysical products generated by product generation module 150.

Simulator 40 or one or more components of simulator 40 may include logic, an interface, memory, other component, or any suitable combination of the preceding. "Logic" may refer to hardware, software, other logic, or any suitable combination of the preceding. Certain logic may manage the operation of a device, and may comprise, for example, a processor. "Processor" may refer to any suitable device operable to execute instructions and manipulate data to perform operations. "Interface" may refer to logic of a device operable to receive input for the device, send output from the device, perform suitable processing of the input or output or both, or any combination of the preceding, and may comprise one or more ports, conversion software, or both.

"Memory" may refer to logic operable to store and facilitate retrieval of information, and may comprise Random Access Memory (RAM), Read Only Memory (ROM), a magnetic drive, a disk drive, a Compact Disk (CD) drive, a Digital Video Disk (DVD) drive, removable media storage, any other suitable data storage medium, or a combination of any of the preceding.

Modifications, additions, or omissions may be made to simulator 40 without departing from the scope of the invention. The components of simulator 40 may be integrated or separated according to particular needs. Moreover, the operations of simulator 40 may be performed by more, fewer, or other modules. Additionally, operations of simulator 40 may be performed using any suitable logic comprising software, hardware, other logic, or any suitable combination of the preceding. As used in this document, "each" refers to each member of a set or each member of a subset of a set.

For illustration purposes only, simulator 40 may simulate the operation of a sensing system in response to a simulated environment. As an example, the environment may be generated from Moderate-resolution Imaging Spectroradiometer (MODIS) Airborne Simulator data and from the red and near infrared (NIR) portion of the spectrum from a scene. The MODIS Airborne Simulator (MAS) data may include red reflectance, NIR reflectance, and Normalized Difference Vegetation Index (NDVI). The red and NIR reflectance data may be used to simulate space-based measurements.

The input data may be determined to represent a real data, high spatial resolution (RHR) scene, so the instrument spectral response may not be applied, but the spatial and radiometric responses may be applied. That is, the orbit modeling, radiative transfer, and spectral response modules may be bypassed. Other modules may be bypassed, such as the spatial filtering, resampling, bit error rate, and navigation modules. Truth for the radiances and the NDVI may be set as a straight spatial average ("boxcar") over each pixel.

Results may be organized in any suitable manner. According to one embodiment, results may be organized as histograms for normalized red reflectance, NIR reflectance, and NDVI. As an example, a histogram may show reflectance along the x-axis and the number of occurrences along the y-axis. The bins along the x-axis of the histograms may be normalized.

Figure 2:
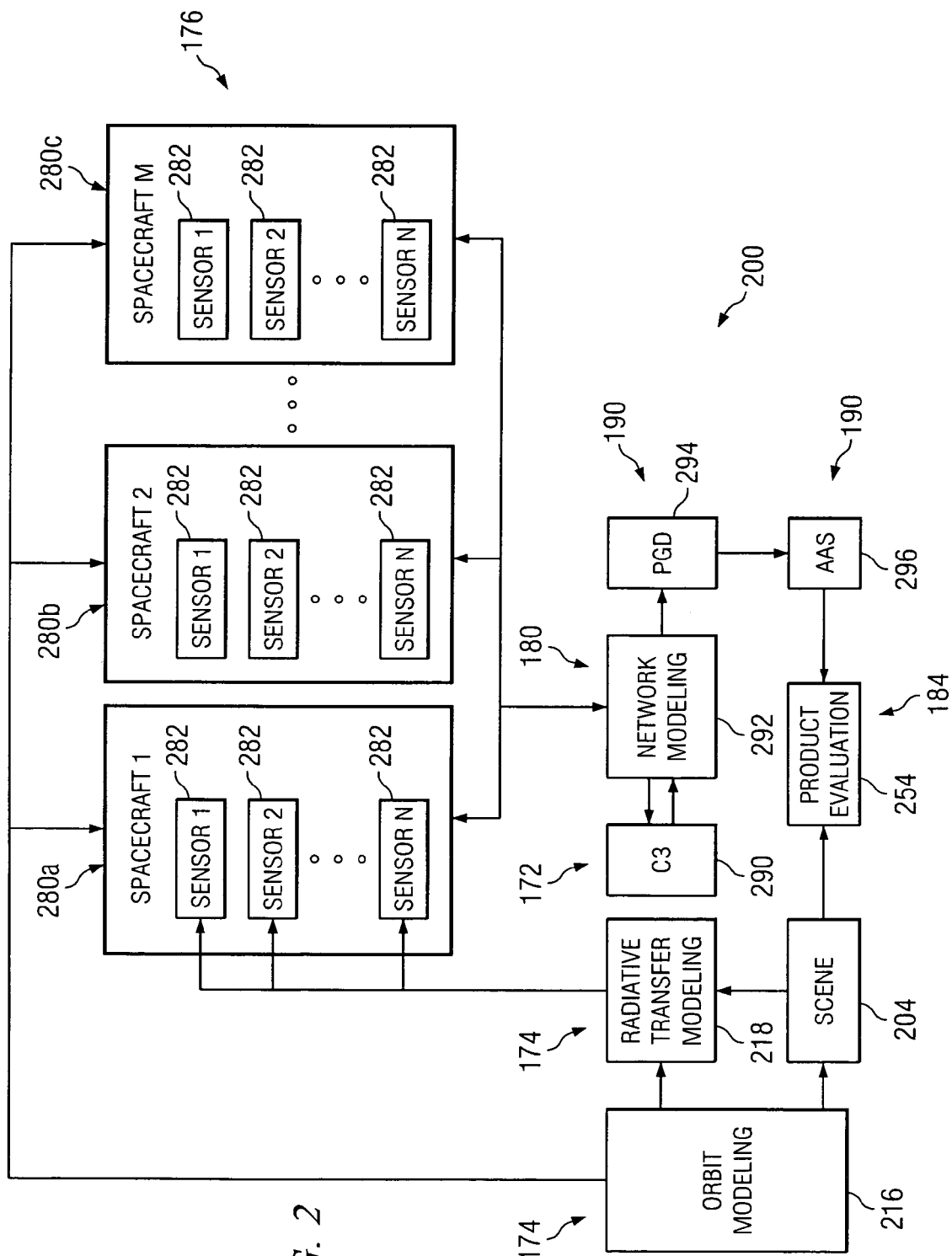
FIG. 2 is a block diagram of another embodiment of a simulator operable to simulate a sensing system.

FIG. 2 is a block diagram of one embodiment of a simulator 200 for simulating a sensing system. In general, simulator 200 receives an input scene, and models the path of a sensor sensing the input scene. The transfer of radiance from the scene to the sensor and the response of the sensor to the radiation are also modeled. Geophysical products determined from the response of the sensor may be compared with the input scene, and the sensor may be evaluated in accordance with the comparison.

According to the illustrated embodiment, an input scene 204 is received by simulator 200. Input scene 204 may be substantially similar to input scene 104 of FIG. 1. Simulator 200 includes control modules 172, environment modules 174, instrument response modules 176, communication modules 180, ground segment modules 190, and geophysical product modules 184 coupled as shown. Control modules 172, environment modules 174, instrument response modules 176, communication modules 180, and geophysical product modules 184 may be substantially similar to control modules 72, environment modules 74, instrument response modules 76, communication modules 80, and geophysical product modules 84, respectively, of FIG. 1.

Control modules 172 receive instructions and direct the operation of simulator 40 in accordance with instructions. Control modules 172 may include a command, control, and communication (C3) module 290. Command, control, and communication module 290 manages the command, control, and communication operations of simulator 200.

Environment modules 174 generate the simulated environment, and may include an orbit modeling module 216 and a radiative transfer modeling module 218. Orbit modeling module 216 models the orbits of the sensors 282, and may be substantially similar to orbit modeling module 116 of FIG. 1. Radiative transfer module 218 simulates how the earth's atmosphere affects radiation traveling from the scene to the sensing system, and may be substantially similar to radiative transfer modeling module 118 of FIG. 1.

Instrument response modules 176 describe the response of the sensors 282 to radiation received from the scene. Communication modules 180 describe the communication of data between modules of the space segment and modules of the ground segment, and may include a network modeling module 292. Network modeling module 292 models the communication network that communicates data between modules of the space segment and modules of the ground segment.

Ground segment modules 190 may include modules of ground segments 56 and 58 of FIG. 1, and may include a product generation and distribution (PGD) module 294 and an archive and access segment (AAS) module 296. Product generation and distribution module 294 generates and distributes geophysical products from radiance product data. Archive and access segment module 296 performs data management operations.

Geophysical product modules 184 process radiance product data to generate geophysical products, and may include a product evaluation module 254. Product evaluation module 254 evaluates the accuracy of the sensing system, and may be substantially similar to product evaluation module 154 of FIG. 1.

Modifications, additions, or omissions may be made to system 200 without departing from the scope of the invention.

The components of system 200 may be integrated or separated according to particular needs. Moreover, the operations of system 200 may be performed by more, fewer, or other modules. Additionally, operations of system 200 may be performed using any suitable logic comprising software, hardware, other logic, or any suitable combination of the preceding.

Figure 3:
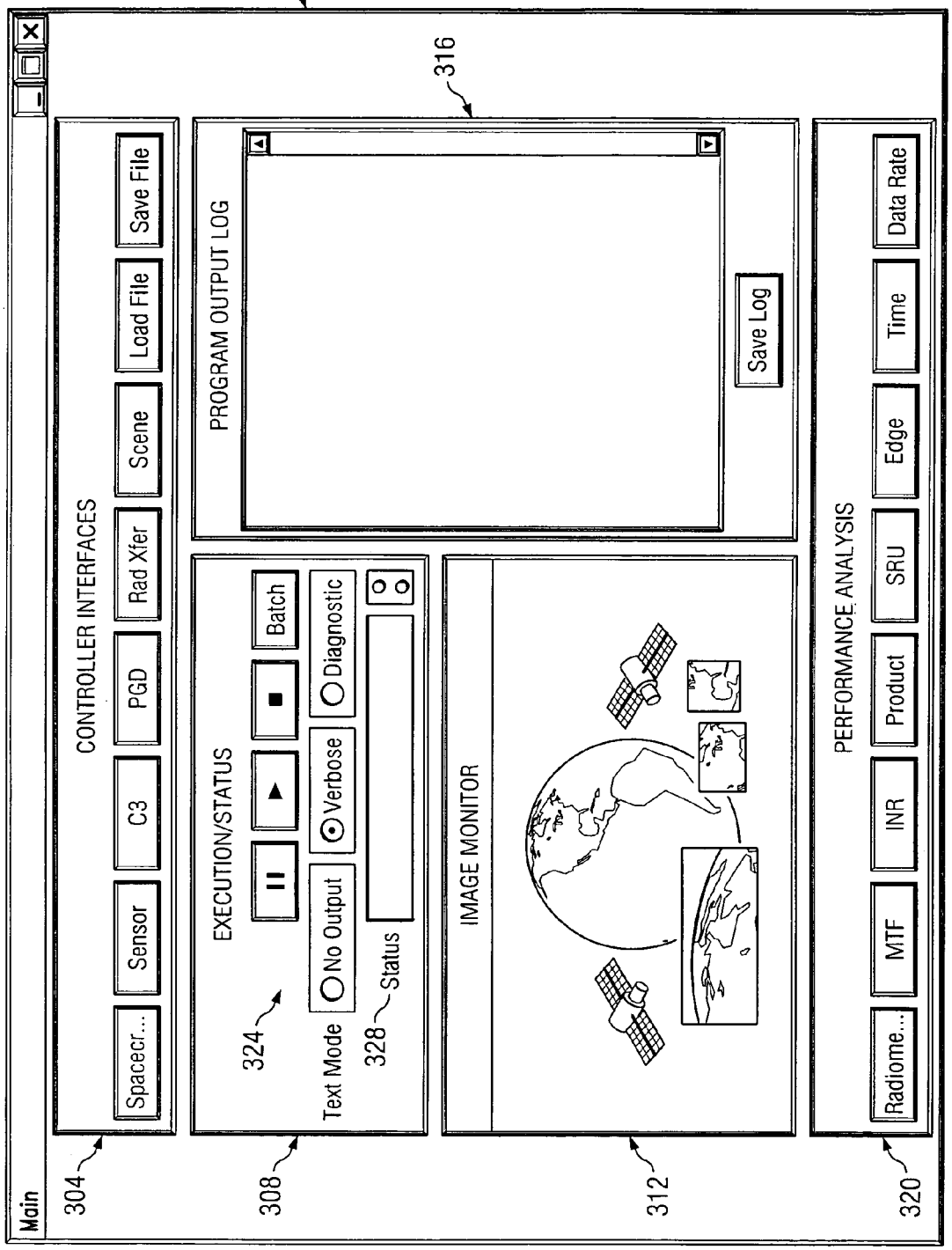
FIG. 3 illustrates an example main graphical user interface that may be used with the shell of the simulator of FIG. 1.

FIG. 3 illustrates an example main graphical user interface 300 that may be used with shell 44 of simulator 40 of FIG. 1. Main graphical user interface 300 may be used to control the operation of simulator 40, and may include any suitable graphical elements for controlling the operation of simulator 40.

According to the illustrated embodiment, graphical user interface 300 includes controller interface selectors 304, an execution/status section 308, an image monitor 312, a program output log 316, and performance analysis selectors 320. Controller interface selectors 304 includes selectors to select a controller interface. A selector may refer to a graphical element that may be used to select an option. As an example, a button may be selected to select the option represented by a button. As another example, an option may be selected from a menu. As another example, the name of an option may be inserted into a field in order to select the option.

Controller interfaces refer to graphical user interfaces that may be used to manage the simulation operations of the modules of simulator 200. According to the illustrated embodiment, controller interface selectors 304 include selectors for spacecrafts 280, sensors 282, C3 module 172, product generation and distribution (PGD) module 294, radiative transfer (RadXfer) modeling module 218, and input scene 204. Controller interface selector 304 may also include selectors for loading a file and for saving a file.

According to the illustrated embodiment, execution/status section 308 includes an execution section 324 and a status section 328. Execution section 324 includes selectors for managing the execution of simulator 200. According to the illustrated embodiment, execution section 324 includes a pause button, a play button, and a stop button for pausing, playing, or stopping, respectively, the simulation. A batch button may be used to run a simulation in batches. As an example, a sequence of simulations may be executed, where each simulation is executed with different input scenes and parameters.

Execution section 24 may also include buttons for selecting a text mode for the output of the simulation. A no output button may be selected to yield no output. A verbose button may be selected to yield the results from product evaluation module 254. A diagnostic button may be selected to yield more details from the results, for example, details about the pixels of the resulting image. Status section 328 includes fields for displaying the status of the simulation. As an example, the status may include the instrument and channel that is being simulated.

Image monitor 312 displays images resulting from the simulation. As an example, image monitor 312 may display graphs of results obtained from the simulation. Program output log 316 displays program text output from the simulation. The output may be displayed in real time.

Performance analysis selectors 320 include selectors for selecting a factor with which to evaluate the sensing system. According to the illustrated embodiment, performance analysis selectors 320 include selectors for radiometry, modulation transfer function (MTF), image navigation and registration (INR), geophysical product, spatial response uniformity (SRU), edge response, time, and data rate.

Modifications, additions, or omissions may be made to interface 300 without departing from the scope of the invention. Interface 300 may include more, fewer, or other graphical elements. Additionally, the graphical elements may be placed in any suitable arrangement without departing from the scope of the invention.

Figure 4B:
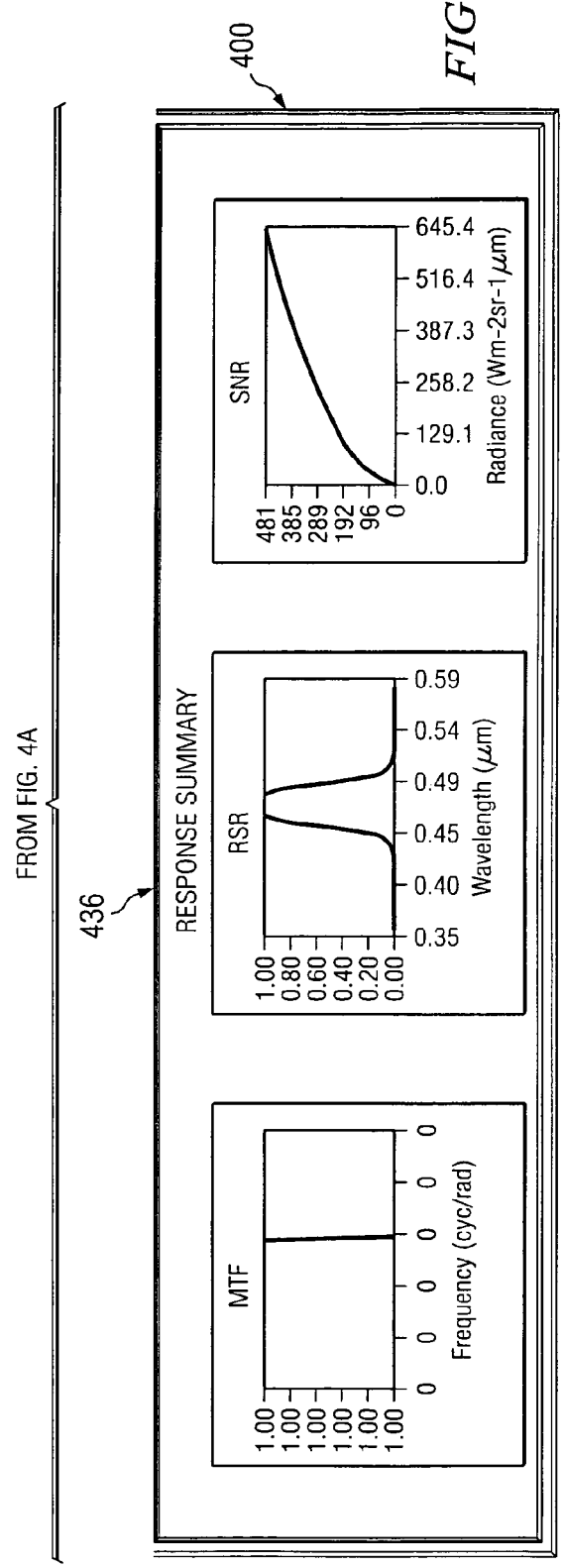
FIG. 4 illustrates an example channel editor graphical user interface that may be used with the shell of the simulator of FIG. 1.

FIG. 4 illustrates an example channel editor graphical user interface 400 that may be used with shell 44 of simulator 40 of FIG. 1. Channel editor graphical user interface 400 may be used to control the parameters of the simulation.

According to the illustrated embodiment, channel editor graphical user interface 400 includes a channel selection section 404, a channel toggle section 408, a data compression section 412, a detector parameter section 416, a spectral parameter section 420, a modulation transfer function (MTF) parameter section 424, a digitization parameter section 428, a radiometry parameter section 432, and a response summary section 436.

Channel selection section 404 may be used to select a channel of a sensor 282 of a spacecraft 280. According to the illustrated embodiment, channel selection section 404 includes selectors for a channel, a sensor 282, and a spacecraft 280. Channel toggle section 408 may be used to toggle a channel on or off. Data compression section 412 may be used to manage data compression for the simulation. According to the illustrated embodiment, data compression section 412 includes selectors to select a data compression algorithm and parameters for the algorithm.

Detector parameter section 416 may be used to set the parameters of sensor 282 for the simulation. According to the illustrated embodiment, detector parameters section 416 includes fields for selecting a detector size along scan, a detector size cross scan, an instantaneous field of view (IFOV) along scan, an instantaneous field of view cross scan, a nadir ground sampling distance (GSD), an angular sampling distance (ASD), a number of columns, a gap size, or other distance. Section 416 may also include fields for a settle time, a reset time, a frame time, an integration time, or other time parameter. Section 416 may also include fields for an integration drag, a quantum efficiency, saturation margin, or other parameter.

Spectral parameter section 420 includes fields for setting spectral parameters. According to the illustrated embodiment, spectral parameters section 420 includes fields for a center, a width, a detector cut on, a detector cut off, a relative spectral response (RSR) value, or other spectral parameter.

Modulation transfer function (MTF) parameter section 424 includes fields for setting modulation transfer function parameters. According to the illustrated embodiment, section 424 includes fields for a blur radius, and a manufacturing tolerance.

Digitization parameter section 428 includes fields for setting digitization parameters. According to the illustrated embodiment, section 428 includes fields for a bits downlink (D/L) value, a bits for analog-to-digital conversion (ADC) value, an ADC equivalent value, a space view offset, or other digitization parameter.

Radiometry parameter section 432 includes fields for setting radiometry parameters. According to the illustrated embodiment, section 432 includes parameters for the radiance of the sun ($L_{sun}$) a maximum radiance ($L_{max}$), a maximum observable power ($Q_{max}$), a calibration error, a noise equivalent charge (NEC) leakage, an NEC readout, an NEC system, an NEC digit, a direct current (DC) restore samples value, a drift time, a 1/f current, a 1/f knee, a warm transmittance value, a cold transmittance value, a total transmittance value, or other radiometry parameter.

Response summary section 436 includes displays of the simulation in response to the designated parameters. According to the illustrated embodiment, response summary section 436 includes displays for a modulation transfer function (MTF), a relative spectral response (RSR), and a signal to noise ratio (SNR).

Modifications, additions, or omissions may be made to the interfaces without departing from the scope of the invention. The interfaces may include more, fewer, or other graphical elements. Additionally, the graphical elements may be placed in any suitable arrangement without departing from the scope of the invention.

Certain embodiments of the invention may provide one or more technical advantages. A technical advantage of one embodiment may be that the simulator may integrate various modules such that output from one module may be automatically input into the next module. Integrating the modules may provide for more efficient simulation, since user intervention may be reduced.

Another technical advantage of one embodiment may be that the simulator may receive any of a variety of types of data, and may select instrument response appropriate for the type of data. This may allow for more efficient processing of different types of data. Another technical advantage of one embodiment may be that the simulator may provide for comprehensive sensing system simulation. The simulator may provide information on how to optimize the aperture and detectors of the sensing system and the spectral channels. The simulator may also provide information on how to lay out the spacecraft and to time the ground system processing.

While this disclosure has been described in terms of certain embodiments and generally associated methods, alterations and permutations of the embodiments and methods will be apparent to those skilled in the art. Accordingly, the above description of example embodiments does not constrain this disclosure. Other changes, substitutions, and alterations are also possible without departing from the spirit and scope of this disclosure, as defined by the following claims.

What is claimed is:

1. A simulator for simulating a sensing system, comprising:
    a plurality of modules operable to simulate one or more sensors sensing a scene, the plurality of modules comprising:
        a path modeling module operable to model a path for each sensor of the one or more sensors;
        a radiative transfer module operable to model a transfer of radiance from the scene to each sensor of the one or more sensors; and
        one or more instrument response modules operable to model the response of the one or more sensors to the transferred radiance; and
    a control module operable to manage the operation of the plurality of modules.

2. The simulator of claim 1, further comprising a product evaluation module operable to:
    receive one or more geophysical products determined in accordance with the response of the one or more sensors;
    compare the geophysical products with the scene; and
    evaluate the one or more sensors in accordance with the comparison.

3. The simulator of claim 1, further comprising a resampling module operable to:
    receive one or more radiance products generated in accordance with the response of the one or more sensors, the radiance products organized in a first coordinate system; and
    map the radiance products from the first coordinate system to a second coordinate system.

4. The simulator of claim 1, further comprising a product generation module operable to:
    receive one or more radiance products generated in accordance with the response of the one or more sensors; and
    generate one or more geophysical products in accordance with the radiance products.

5. The simulator of claim 1, wherein the control module is operable to:
    receive data describing the scene;
    identify a data type associated with the data; and
    control the one or more instrument response modules in accordance with the identification.

6. The simulator of claim 1, wherein the one or more instrument response modules further comprises a spectral response module operable to:
    receive hyper-spectral data; and
    combine the hyper-spectral data to yield an integrated measurement.

7. The simulator of claim 1, wherein the one or more instrument response modules further comprises a spatial response module operable to:
    identify data having a spatial resolution greater than that a spatial resolution associated with the one or more sensors; and
    combine the identified data to yield an integrated measurement.

8. A method for simulating a sensing system, comprising:
    simulating one or more sensors sensing a scene, the simulation performed by a plurality of modules, the simulation comprising:
        modeling a path for each sensor of the one or more sensors, the path modeled by a path modeling module;
        modeling a transfer of radiance from the scene to each sensor of the one or more sensors, the transfer of radiance modeled by a radiative transfer module; and
        modeling the response of the one or more sensors to the transferred radiance, the response modeled by one or more instrument response modules; and
    managing the operation of the plurality of modules using a control module.

9. The method of claim 8, further comprising evaluating the one or more sensors using a product evaluation module, the evaluation comprising:
    receiving one or more geophysical products determined in accordance with the response of the one or more sensors;
    comparing the geophysical products with the scene; and
    evaluating the one or more sensors in accordance with the comparison.

10. The method of claim 8, further comprising mapping using a resampling module, the mapping comprising:
    receiving one or more radiance products generated in accordance with the response of the one or more sensors, the radiance products organized in a first coordinate system; and
    mapping the radiance products from the first coordinate system to a second coordinate system.

11. The method of claim 8, further comprising generate one or more geophysical products using a product generation module, the generation comprising:
    receiving one or more radiance products generated in accordance with the response of the one or more sensors; and
    generating one or more geophysical products in accordance with the radiance products.

12. The method of claim 8, wherein managing the operation of the plurality of modules further comprises:
receiving data describing the scene;
identifying a data type associated with the data; and
controlling the one or more instrument response modules in accordance with the identification.

13. The method of claim 8, further comprising combining data using a spectral response module, the combining comprising:
receiving hyper-spectral data; and
combining the hyper-spectral data to yield an integrated measurement.

14. The method of claim 8, further comprising combining data using a spatial response module, the combining comprising:
identifying data having a spatial resolution greater than that a spatial resolution associated with the one or more sensors; and
combining the identified data to yield an integrated measurement.

15. Software for simulating a sensing system, the software embodied in a medium and comprising:
a plurality of modules operable to simulate one or more sensors sensing a scene, the plurality of modules comprising:
a path modeling module operable to model a path for each sensor of the one or more sensors;
a radiative transfer module operable to model a transfer of radiance from the scene to each sensor of the one or more sensors; and
one or more instrument response modules operable to model the response of the one or more sensors to the transferred radiance; and
a control module operable to manage the operation of the plurality of modules.

16. The software of claim 15, further comprising a product evaluation module operable to:
receive one or more geophysical products determined in accordance with the response of the one or more sensors;
compare the geophysical products with the scene; and
evaluate the one or more sensors in accordance with the comparison.

17. The software of claim 15, further comprising a resampling module operable to:
receive one or more radiance products generated in accordance with the response of the one or more sensors, the radiance products organized in a first coordinate system; and
map the radiance products from the first coordinate system to a second coordinate system.

18. The software of claim 15, further comprising a product generation module operable to:
receive one or more radiance products generated in accordance with the response of the one or more sensors; and
generate one or more geophysical products in accordance with the radiance products.

19. The software of claim 15, wherein the control module is operable to:
receive data describing the scene;
identify a data type associated with the data; and
control the one or more instrument response modules in accordance with the identification.

20. The software of claim 15, wherein the one or more instrument response modules further comprises a spectral response module operable to:
receive hyper-spectral data; and
combine the hyper-spectral data to yield an integrated measurement.

21. The software of claim 15, wherein the one or more instrument response modules further comprises a spatial response module operable to:
identify data having a spatial resolution greater than that a spatial resolution associated with the one or more sensors; and
combine the identified data to yield an integrated measurement.

22. A system for simulating a sensing system, comprising:
means for simulating one or more sensors sensing a scene, the simulation performed by a plurality of modules, the simulation comprising:
modeling a path for each sensor of the one or more sensors, the path modeled by a path modeling module;
modeling a transfer of radiance from the scene to each sensor of the one or more sensors, the transfer of radiance modeled by a radiative transfer module; and
modeling the response of the one or more sensors to the transferred radiance, the response modeled by one or more instrument response modules; and
means for managing the operation of the plurality of modules using a control module.

23. A simulator for simulating a sensing system, comprising:
a plurality of modules operable to simulate one or more sensors sensing a scene, the plurality of modules comprising:
a path modeling module operable to model a path for each sensor of the one or more sensors;
a radiative transfer module operable to model a transfer of radiance from the scene to each sensor of the one or more sensors;
one or more instrument response modules operable to model the response of the one or more sensors to the transferred radiance, the one or more instrument response modules further comprising:
a spectral response module operable to:
receive hyper-spectral data; and
combine the hyper-spectral data to yield an integrated measurement; and
a spatial response module operable to:
identify data having a spatial resolution greater than that a spatial resolution associated with the one or more sensors; and
combine the identified data to yield an integrated measurement; a resampling module operable to:
receive one or more radiance products generated in accordance with the response of the one or more sensors, the radiance products organized in a first coordinate system; and
map the radiance products from the first coordinate system to a second coordinate system;
a product generation module operable to:
receive the one or more radiance products generated in accordance with the response of the one or more sensors; and generate one or more geophysical products in accordance with the radiance products;
a product evaluation module operable to:
receive the one or more geophysical products determined in accordance with the response of the one or more sensors;
compare the geophysical products with the scene; and
evaluate the one or more sensors in accordance with the comparison;

a control module operable to manage the operation of the plurality of modules, the control module operable to:
receive data describing the scene;
identify a data type associated with the data; and
control the one or more instrument response modules in accordance with the identification.

\* \* \* \* \*